United States Patent
Mizuta et al.

(10) Patent No.: US 8,611,089 B2
(45) Date of Patent: Dec. 17, 2013

(54) HEAT PIPE AND CIRCUIT BOARD WITH A HEAT PIPE FUNCTION

(75) Inventors: Kei Mizuta, Kagoshima (JP); Katsuya Tsuruta, Kagoshima (JP); Toshiaki Kotani, Kagoshima (JP); Kenji Ohsawa, Kagoshima (JP)

(73) Assignees: Fuchigami Micro Co., Ltd., Kagoshima (JP); Kagoshima University, Kagoshima (JP)

( * ) Notice: Subject to any disclaimer, the term of this patent is extended or adjusted under 35 U.S.C. 154(b) by 318 days.

(21) Appl. No.: 12/934,996

(22) PCT Filed: Mar. 9, 2009

(86) PCT No.: PCT/JP2009/054415
§ 371 (c)(1),
(2), (4) Date: May 25, 2011

(87) PCT Pub. No.: WO2009/119289
PCT Pub. Date: Oct. 1, 2009

(65) Prior Publication Data
US 2012/0106084 A1     May 3, 2012

(30) Foreign Application Priority Data
Mar. 26, 2008    (JP) ................................ 2008-080862

(51) Int. Cl.
*H05K 7/20*        (2006.01)

(52) U.S. Cl.
USPC .............. 361/700; 361/679.46; 361/679.47; 361/679.52; 361/702; 361/720; 165/104.21; 165/104.26; 165/104.33; 165/185; 174/252

(58) Field of Classification Search
USPC .......... 361/679.46, 679.53, 679.55, 688, 689, 361/699, 698, 700, 701, 702, 715, 719; 165/104.14, 104.21, 104.26, 104.33, 165/167, 168, 170, 185; 257/714, 715; 29/890.03, 890.032, 890.033, 890.041, 29/890.039, 890.046, 525.1, 527.1; 174/15.2, 16.3, 252
See application file for complete search history.

(56) References Cited

U.S. PATENT DOCUMENTS

| | | | |
|---|---|---|---|
| 4,559,580 A | * | 12/1985 | Lutfy ............................ 361/689 |
| 6,719,040 B2 | * | 4/2004 | Sugito et al. ............. 165/104.21 |
| 6,788,537 B2 | | 9/2004 | Saita et al. |
| 6,861,692 B2 | * | 3/2005 | Kijirai et al. .................. 257/302 |
| 6,863,117 B2 | * | 3/2005 | Valenzuela .............. 165/104.26 |

(Continued)

FOREIGN PATENT DOCUMENTS

| | | |
|---|---|---|
| JP | H07-098619 | 11/1996 |
| JP | 410308486 A * | 11/1998 |
| JP | H09-181458 | 11/1998 |

(Continued)

OTHER PUBLICATIONS

U.S. Appl. No. 10/583,504, filed Mar. 15, 2007, Ohsawa.

(Continued)

*Primary Examiner* — Michail V Datskovskiy
(74) *Attorney, Agent, or Firm* — Timothy M. Morella

(57) ABSTRACT

A heat pipe for cooling an exothermic body by the vaporization and condensation of an enclosed cooling medium is disclosed. The heat pipe comprises a flat plate-like upper plate, a flat plate-like lower plate opposed to the upper plate, and a plurality of flat plate-like intermediate plates overlaid on each other between the upper plate and the lower plate and having internal through-holes. The internal through-holes formed in each of a plurality of the intermediate plates are adapted such that only part of each through-hole is overlapped on each other to form capillary tube paths, each having a cross-sectional area smaller than the cross-sectional area of the through-hole in the flat surface direction.

16 Claims, 10 Drawing Sheets

(56) References Cited

U.S. PATENT DOCUMENTS

| | | | |
|---|---|---|---|
| 6,863,119 B2 * | 3/2005 | Sugito et al. | 165/104.33 |
| 7,051,793 B1 * | 5/2006 | Schulz-Harder | 165/104.26 |
| 7,775,261 B2 * | 8/2010 | Valenzuela | 165/104.26 |
| 8,056,615 B2 * | 11/2011 | Downing | 165/80.4 |
| 2002/0135979 A1 * | 9/2002 | Estes et al. | 361/688 |
| 2004/0069460 A1 * | 4/2004 | Sasaki et al. | 165/104.26 |
| 2007/0056711 A1 * | 3/2007 | Ohsawa | 165/104.21 |

FOREIGN PATENT DOCUMENTS

| | | | |
|---|---|---|---|
| JP | 411031768 A * | 2/1999 | |
| JP | H09-186165 | 2/1999 | |
| JP | 2000-253117 | 2/2002 | |
| JP | 2002039693 A * | 2/2002 | |
| JP | 2002-033410 | 8/2003 | |
| JP | 2003240459 A * | 8/2003 | |
| JP | 2006-060372 | 9/2007 | |

OTHER PUBLICATIONS

U.S. Appl. No. 11/573,534, filed Jun. 12, 2008, Ohsawa et al.

International Search Report for PCT Patent Application No. PCT/JP2009/0054415. Jun. 2, 2009.

* cited by examiner (a)

(b)

Vapor Diffusion Path

Capillary Tube Path

HEAT PIPE AND CIRCUIT BOARD WITH A HEAT PIPE FUNCTION

REFERENCE To RELATED APPLICATIONS

The Present Application is a United States National Phase Application, based on PCT Patent Application No. PCT/JP2009/054415, filed with the Receiving Office of the Japanese Patent Office on 9 Mar. 2009. The PCT Patent Application (and, by extension, the Present Application) claims priority to Japanese Application No. 2008-080862, filed 26 Mar. 2008 with the Japanese Patent Office. The disclosures of both the PCT and the Japanese Applications are incorporated herein by reference in their entireties.

BACKGROUND OF THE PRESENT APPLICATION

The Present Application relates, generally, to a heat pipe for cooling exothermic bodies such as semiconductor integrated circuits, LED elements and power devices, a method for manufacturing the heat pipe and circuit boards with the heat pipe function.

Electronic devices such as semiconductor integrated circuits, LED elements and power devices are used for electronic equipment, industrial equipment and automobiles. These electronic parts are exothermic bodies that generate heat by the current flowing inside. When exothermic bodies are heated to a give temperature or above, the operation may not be guaranteed, or other parts and the housing may be adversely influenced. As a result, the performance of electronic equipment and industrial equipment may be deteriorated.

In order to cool such exothermic bodies, some heat pipes have been proposed that have the cooling effects by the vaporization and condensation of enclosed cooling media.

On the other hand, there is a need for the high-density packaging of electronic parts and elements because electronic equipment and industrial equipment have been miniaturized. Since only one side of it is brought into contact with an electronic part or an element, a heat pipe may occupy an unnecessary capacity in electronic equipment. In the case that electronic parts, which are exothermic bodies, are smaller in size than a heat pipe, it may be difficult for electronic parts other than those to be cooled to be mounted at the place where the heat pipe is installed. As a result, the heat pipe may prevent the high-density packaging. Or, the cooling capacity of the heat pipe may not be fully utilized.

Some technologies have been proposed for enhancing the packaging density, wherein through-holes are formed on a metal core printed circuit board having a cooling function. See, for example, Japanese Patent Application No. 2007-242740. Some technologies for facilitating the mounting of heat pipes have also been proposed. See, for example, Japanese Patent Application No. 2004-037001. Moreover, some technologies for providing a concave curved section on the surface of a heat pipe have been proposed for enhancing the cooling performance of the heat pipe and utilizing the surface. See, for example, Japanese Patent Application No. H11-101585.

In the '240 Application, a via hole having a small diameter is formed after performing the thin wall processing on a metal core layer. In this case, since the via hole is formed after pasting insulating layers on both surfaces of the thin wall processed metal core layer, the position of the via hole may be shifted when the thin wall section is too thin. Moreover, it is difficult to process a heat pipe whose inside is hollow (the inside of a heat pipe is hollow for the purpose of enclosing a cooling medium) unlike a metal core layer. This is because the position and shape of a via hole may be shifted by the pressure put on the metal board sections on the upper and lower layers of the cavity. Accordingly, it is difficult to apply the technology for forming a via hole after providing a metal core layer with a thin wall section to the formation of a via hole in a heat pipe.

The '001 Application can facilitate the mounting of a heat pipe. However, other electronic parts cannot be mounted on the place where a heat pipe is mounted. Hence, the problem that a heat pipe may inhibit the high-density packaging cannot be solved. In addition, there is another problem that the enclosure of the inner space may be destroyed at the time of forming a via hole on the outer peripheral section of a heat pipe.

The '585 Application enables to mount electronic parts along the curved section of a heat pipe. However, this is limited to the lead wiring along the curved section. In reality, it is difficult to mount electronic parts on a heat pipe.

None of these references, however, enables to realize a heat pipe that does not prevent the high-density packaging. Particularly, as there may be an increasing need for enhancing the cooling capability in the future, it is inevitable that the size of a heat pipe increases. Thus, there is a need for a heat pipe that does not prevent the high-density packaging even when its size is increased.

SUMMARY OF THE PRESENT APPLICATION

Accordingly, the purpose of the Present Application is to provide a heat pipe that does not prevent the high-density packaging and is excellent at cooling effects, a method for manufacturing the heat pipe, and a circuit board having the heat pipe function.

A heat pipe according to the Present Application cools an exothermic body by the vaporization and condensation of an enclosed cooling medium and is provided with a flat plate-like upper plate, a flat plate-like lower plate opposed to the upper plate and a plurality of flat plate-like intermediate plates overlaid on each other between the upper plate and the lower plate and having internal through-holes, wherein: the internal through-holes formed in each of a plurality of the intermediate plates are adapted such that only part of each through-hole is overlapped on each other to form capillary tube paths, each having a cross-sectional area smaller than the cross-sectional area of the through-hole in the flat surface direction; the upper plate, the lower plate and a plurality of the intermediate plates each have an external through-hole; and the external through-hole formed in the upper plate, the external through-hole formed in the lower plate and the external through-holes formed in the intermediate plates are superposed on each other to form a via hole.

The Present Application can realize a heat pipe that is flat plate-like and enables a cooling medium to circulate in both the perpendicular direction and the flat surface direction for heat transfer at a high speed. In addition, the Present Application can form a via hole having an extremely small diameter in a heat pipe without adversely influencing the strength and durability of the heat pipe. Moreover, electronic parts can be electronically connected to each other through a via hole provided in a heat pipe, whereby the use of a heat pipe does not prevent the high-density packaging. Additionally, electronic parts can be cooled and mounted at the same time.

The heat pipe according to the Present Application is a heat pipe for cooling an exothermic body by the vaporization and condensation of an enclosed cooling medium, the heat pipe comprising a flat plate-like upper plate, a flat plate-like lower plate opposed to the upper plate and a plurality of flat plate-like intermediate plates overlaid on each other between the upper plate and the lower plate and having internal through-holes, wherein: the internal through-holes formed in each of a plurality of the intermediate plates are adapted such that only part of each through-hole is overlapped on each other to form capillary tube paths, each having a cross-sectional area smaller than the cross-sectional area of the through-hole in the flat surface direction; the upper plate, the lower plate and a plurality of the intermediate plates each have an external through-hole; and the external through-hole formed in the upper plate, the external through-hole formed in the lower plate and the external through-holes formed in the intermediate plates are superposed on each other to form a via hole. This configuration enables to form a via hole having a minute diameter in a heat pipe. In addition, a flat plate-like heat pipe whose cooling capability is high can be achieved.

In addition, the heat pipe is characterized in that the external through-hole provided in each of the upper plate, the lower plate and a plurality of the intermediate plates is smaller than the diameter based on the processing limit to the thickness of the heat pipe and equal to or greater than the diameter based on the processing limit to the thickness of each of the upper plate, the lower plate and a plurality of the intermediate plates.

In addition, the heat pipe is characterized in that the processing limit is represented by the following expression:

$$(½)*t \leq \phi d$$

wherein the thickness of a plate forming the external through-hole is t and the diameter of the external through-hole $\phi d$. This configuration enables to form a via hole having a minute diameter while complying with the processing limit. As a result, neither the strength nor the durability of a heat pipe is adversely influenced.

In addition, the heat pipe is characterized in that at least one of the upper plate, the lower plate and the intermediate plates is constituted of a plurality of members, the members being able to be bonded together in the thickness direction. This configuration enables to further reduce the diameter of an external through-hole penetrating any one of the upper plate, the lower plate and a plurality of the intermediate plates. As a result, the diameter of a via hole can be further reduced.

In addition, the heat pipe is characterized in that the heat pipe is manufactured, wherein: the upper plate having the external through-hole, the lower plate having the external through-hole and a plurality of the intermediate plates each having the internal through-hole and the external through-hole are overlaid on each other by sandwiching a plurality of the intermediate plates between the upper plate and the lower plate; the external through-hole formed in the upper plate, the external through-hole formed in the lower plate and the external through-holes formed in a plurality of the intermediate plates are superposed on each other to form a via hole, the via hole penetrating the upper plate all the way through the lower plate; and the internal through-holes formed in each of a plurality of the intermediate plates are adapted such that only part of each through-hole is overlapped on each other to form capillary tube paths, each having a cross-sectional area smaller than the cross-sectional area of the through-hole in the flat surface direction. This configuration enables to form a via hole having a minute diameter while complying with the processing limit. As a result of forming a minute via hole, a heat pipe that has no adverse influence on the high-density packaging can be achieved.

In addition, the heat pipe is characterized in that: each of a plurality of the intermediate plates comprises a notch section and a plate section; the notch section provided in each of a plurality of the intermediate plates is overlapped on each other to form a vapor diffusion path, the vapor diffusion path being an internal space; the vapor diffusion path diffuses a vaporized cooling medium generated by the vaporization of an enclosed cooling medium; and the capillary tube path circulates a condensed cooling medium generated by the condensation of the enclosed cooling medium. This configuration enables to circulate a cooling medium at a high speed and achieve a heat pipe excellent at the efficiency of heat transfer.

In addition, the heat pipe is characterized in that the via hole is disposed in the vicinity of the borderline between the plate section and the notch section in a plurality of the intermediate plates. This configuration enables to form a via hole that hardly influences the cooling capability.

In addition, the heat pipe is characterized in that each of the upper plate and the lower plate further comprises a concave section, the concave section being linked to the capillary tube path. This configuration enables to accelerate the circulation of a condensed cooling medium.

In addition, the heat pipe is characterized in that the heat pipe is a square of at least 20 square millimeters and not more than 100 square millimeters and has a thickness of at least 1 mm and not more than 5 mm. This configuration enables to achieve a heat pipe that can strike a balance between the cooling and the mounting.

BRIEF DESCRIPTION OF THE FIGURES

The organization and manner of the structure and operation of the Present Application, together with further objects and advantages thereof, may best be understood by reference to the following Detailed Description, taken in connection with the accompanying Figures, wherein like reference numerals identify like elements, and in which.

DESCRIPTION OF THE PREFERRED EMBODIMENTS

While the Present Application may be susceptible to embodiment in different forms, there is shown in the Figures, and will be described herein in detail, specific embodiments, with the understanding that the disclosure is to be considered an exemplification of the principles of the Present Application, and is not intended to limit the Present Application to that as illustrated.

In the illustrated embodiments, directional representations—i.e., up, down, left, right, front, rear and the like, used for explaining the structure and movement of the various elements of the Present Application, are relative. These representations are appropriate when the elements are in the position shown in the Figures. If the description of the position of the elements changes, however, it is assumed that these representations are to be changed accordingly.

As used herein, the term "heat pipe" refers to a member, a part, an instrument or a device that can achieve the function of cooling an exothermic body by repeating the process of a cooling medium enclosed in the inner space being vaporized by receiving heat from the exothermic body and then the vaporized cooling medium being cooled to condensation.

Figure 1:
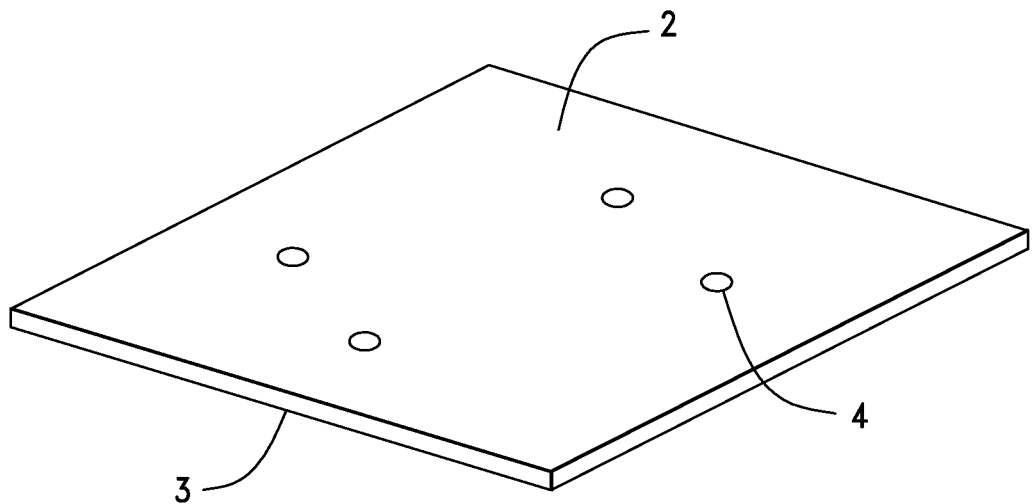
FIG. 1 is a perspective view of a heat pipe of the Present Application.

The heat pipe 1 cools an exothermic body by the vaporization and condensation of a cooling medium enclosed in the internal space. As shown in FIG. 1, a heat pipe 1 is a flat plate-like square. The heat pipe 1 is formed by an upper plate 2 and a lower plate 3 in its outer shape and has a via hole 4 penetrating the upper plate 2 all the way through the lower plate 3. The number of the via hole 4 may be one or multiple and its position decided properly. The heat pipe according to the Present Application is flat plate-like as shown in FIG. 1 and, therefore, can be easily mounted on a circuit board or the like without requiring much mounting space.

The heat pipe 1 has an internal space (not shown here) sandwiched between the upper plate 2 and the lower plate 3, and a cooling medium is enclosed in this inner space. Moreover, the inner space is provided with a capillary tube path and a vapor diffusion path, and a vaporized cooling medium is diffused in both the flat surface direction and the perpendicular direction via the vapor diffusion path. A condensed cooling medium is circulated through the capillary tube path. Although it is flat plate-like, the heat pipe according to the Present Application has enough cooling capability because a cooling medium vaporized through the vapor diffusion path is diffused in both the flat surface direction and the perpendicular direction and a condensed cooling medium is circulated via the capillary tube path in both the flat surface direction and the perpendicular direction.

At least one of the upper plate 2 and the lower plate 3 has a heat receiving face that is brought into contact with an exothermic body, and the other plate has a heat releasing face from where the latent heat of a vaporized cooling medium is released. Since the via hole allows for mounting electronic parts on both faces of the heat pipe according to the Present Application, both the upper plate and the lower plate may play both roles of the heat receiving face and the heat releasing face.

Figure 2:
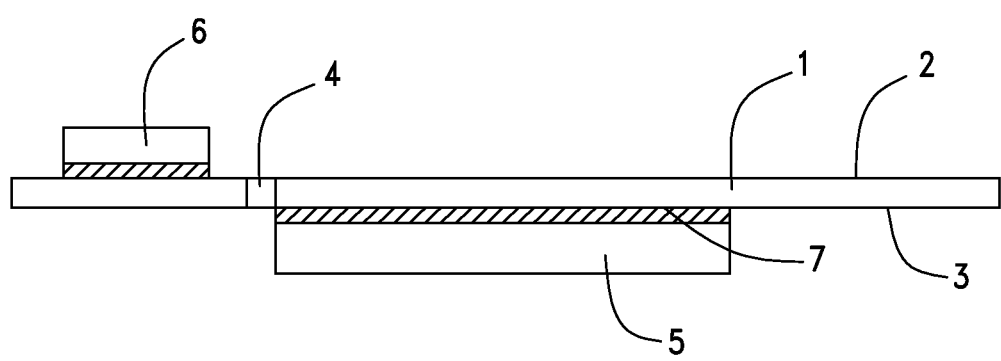
FIG. 2 is a side view of the heat pipe of FIG. 1.

FIG. 2 shows the state in which the heat pipe 1 is brought into contact with exothermic bodies 5 and 6. In FIG. 2, the exothermic bodies 5 and 6 are mounted and brought into contact with both faces of the heat pipe 1. The exothermic bodies 5 and 6 are each brought into contact with the surface of the heat pipe 1 via a thermal binder 7 such as grease. In addition, as described below, the via hole 4 has a wiring layer, and therefore the exothermic bodies 5 and 6 (e.g., electronic parts and semiconductor integrated circuits) can be electronically connected to each other.

A cooling medium is enclosed inside the heat pipe 1. The cooling medium vaporized by heat generated from the exothermic bodies 5 and 6 is diffused through a vapor diffusion path and then cooled and condensed on the heat releasing face. The condensed cooling medium is circulated through the capillary tube path. As a result, the exothermic bodies 5 and 6 are cooled. In this case, the lower plate 3 has the heat receiving face and the upper plate 2 the heat releasing face for the exothermic body 5. For the exothermic body 6, the upper plate 2 has the heat receiving face and the lower plate 3 the heat releasing face. The heat pipe 1 can cool the exothermic bodies 5 and 6 that are brought into contact with both faces because it has the via hole 4. Alternatively, only one exothermic body is cooled and allowed to be electronically connected to the other exothermic body, whereby the high-density packaging is made possible using the heat releasing face. In this manner, the heat pipe 1 can cool the exothermic bodies 5 and 6, which are electronic parts or semiconductor integrated circuits. This is the basic external view and function of the heat pipe according to the Present Application.

Figure 3:
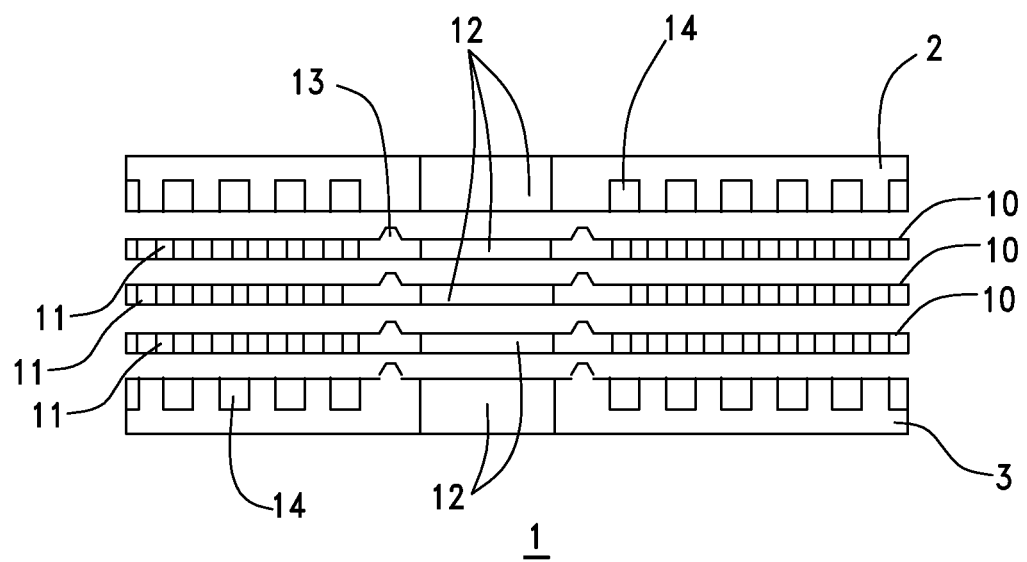
FIG. 3 is a side sectional view of the heat pipe of FIG. 1.
Figure 3:
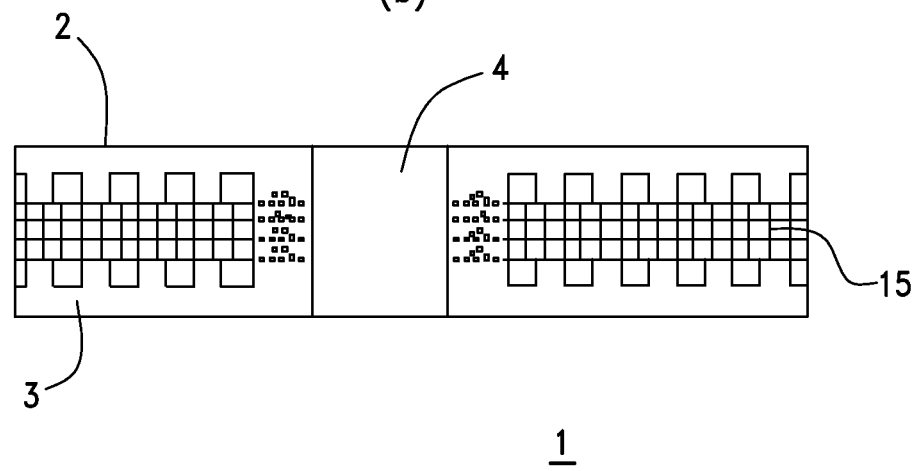

Referring to FIG. 3, the heat pipe 1 is provided with a flat plate-like upper plate 2, a flat plate-like lower plate 3 and a plurality of flat plate-like intermediate plates. The lower plate 3 is disposed on the side opposite the upper plate 2. It is proper that the shape and size of them are substantially the same. It goes without saying, however, that the spirit of the Present Application is not spoiled if they are different.

A plurality of the intermediate plates 10 are overlaid on each other between the upper plate 2 and the lower plate 3. Moreover, each of a plurality of the intermediate plates 10 has internal through-holes 11. At a time when a plurality of the intermediate plates 10 are overlaid on each other, only part of each through-hole 11 is overlapped on each other to form capillary tube paths 15, each capillary tube path 15 having a cross-sectional area smaller than the cross-sectional area of each internal through-hole 11. The capillary tube paths 15 are passages through which a condensed cooling medium is circulated.

Moreover, each of the upper plate 2, the lower plate 3 and a plurality of the intermediate plates 10 has an external through-hole 12. These external through-holes 12 are superposed on each other to form a via hole 4 in the same position at a time when all the upper plate 2, the lower plate 3 and a plurality of the intermediate plates 10 are overlaid on each other. The via hole 4 penetrates the upper plate 2 all the way through the lower plate 3, whereby an exothermic body mounted on the surface of the upper plate 2 and an exothermic body mounted on the surface of the lower plate 3 can be electrically connected to each other.

As shown in FIG. 3, the heat pipe 1 has the via hole 4 and allows mounting and bringing into contact with electronic parts, which are exothermic bodies, on both faces of the heat pipe 4. Alternatively, it enables to electrically connect an electronic part in contact with one face of the heat pipe 1 to another electronic part through the via hole.

The upper plate 2 is flat plate-like and has the external through-hole 12. The number of the external through-hole 12 may be one or multiple. The external through-hole 12 of the upper plate 2 is provided in such a position that it can be brought into the same position as those of a plurality of the intermediate plates 10 and the lower plate 3 at a time when they are overlaid on each other (it is also preferred that their shapes and areas be the same).

The upper plate 2 is formed of a metal or a resin. It is preferred that the upper plate 2 be formed of a metal having a high coefficient of thermal conductivity such as copper, aluminum, silver, an aluminum alloy, iron, an iron alloy and stainless steel. Besides, the upper plate 2 may have a variety of shapes such as a square, a rhombus, a circle, an oval, and a polygon. Nevertheless, a square may be preferable in terms of easy production and mounting.

The upper plate 2 has a concave section 14 linked to a capillary tube path 15 (linked to an internal through-hole 11) on its one side opposed to the intermediate plate 10. The concave section 14 linked to the capillary tube path 15 accelerates a condensed cooling medium to be transferred to the capillary tube path 15 from the upper plate 2. However, the concave section 14 is not an essential claimed element in the Present Application.

The upper plate 2 is referred to as "upper" only for convenience sake. It is not necessary for the upper plate 2 to be disposed on the upper position physically. Nor is it specifically distinguished from the lower plate 3. It is also preferred that the upper plate 2 be provided with a protrusion and an adhesive section to be bonded with the intermediate plate 10.

The lower plate 3 is disposed on the side opposite the upper plate 2 to sandwich a plurality of the intermediate plates 10. The lower plate 3 has the external through-hole 12 like the upper plate 2. It is preferred that the external through-hole 12 of the lower plate 3 is in the same position as that of the upper plate 2 (it is also preferred that the shape and area be the same).

The lower plate 3 is formed of a metal or a resin. It is preferred that the lower plate 3 be formed of a metal having a high coefficient of thermal conductivity such as copper, aluminum, silver, an aluminum alloy, iron, an iron alloy and stainless steel. Besides, the lower plate 3 may have a variety of shapes such as a square, a rhombus, a circle, an oval, and a polygon. It is preferred that the shape and area of the lower plate 3 be the same as those of the upper plate 2 because the lower plate 3 is disposed on the side opposite the upper plate 2 to form the heat pipe 1. Moreover, a square may be preferable in terms of easy production and mounting.

The lower plate 3 has a concave section 14 linked to a capillary tube path 15 (linked to an internal through-hole 11) on its one side opposed to the intermediate plate 10. The concave section 14 linked to the capillary tube path 15 accelerates a condensed cooling medium to be transferred to the capillary tube path 15 from the lower plate 3. This is significant in the same way that it is significant to provide the concave section 14 on the upper plate 2. Particularly, since the heat pipe 1 may be brought into contact with exothermic bodies on both faces, there is some possibility that heat is released on both the upper plate 2 and the lower plate 3 in order to accelerate the condensation of a cooling medium. Accordingly, both the upper plate 2 and the lower plate 3 may play a role in accelerating the circulation of a condensed cooling medium. This is also because it is troublesome for a user to distinguish up from down at the time of installing the manufactured heat pipe 1.

It is preferred that the configuration, shape and material of the lower plate 3 be the same as those of the upper plate 2 in view of mounting electronic parts on both faces and easiness in use. Further, the lower plate 3 is referred to as "lower" only for convenience' sake. It is not necessary for the lower plate 3 to be disposed on the lower position physically. Nor is it specifically distinguished from the upper plate 2. It is also preferred that the lower plate 3 be provided with a protrusion and an adhesive section to be bonded with the intermediate plate 10.

A plurality of the intermediate plates 10 are overlaid on each other between the upper plate 2 and the lower plate 3. There are a plurality of the intermediate plates 10 to be overlaid on each other because only part of the internal through-hole 11 formed in the intermediate plate 10 is overlapped on each other to form a capillary tube path. Each of a plurality of the intermediate plates 10 has the internal through-hole 11 and the external through-hole 12.

Here, it is preferred that the external through-hole 12 of the intermediate plate 10 be in the same position as those of the upper plate 2 and the lower plate 3 (it is also preferred that the shape and area are the same). As used herein, the term "same position" is based on the coordinates at a time when the upper plate 2, the lower plate 3 and the intermediate plates 10 are overlaid on each other. When each external through-hole 12 of a plurality of the intermediate plates 10, the external through-hole 12 of the upper plate 2 and the external through-hole 12 of the lower plate 3 are overlaid on each other, those external through-holes 12 in the same position are linked to each other to form the via hole 4 that penetrates the upper plate 2 all the way through the lower plate 3.

The intermediate plate 10 is formed of a metal or a resin. It is preferred that the lower plate 3 be formed of a metal having a high coefficient of thermal conductivity such as copper, aluminum, silver, an aluminum alloy, iron, an iron alloy and stainless steel. Besides, the lower plate 3 may have a variety of shapes such as a square, a rhombus, a circle, an oval, and a polygon. It is preferred that the shape and area of the lower plate 3 be the same as those of the upper plate 2 because the lower plate 3 is disposed on the side opposite the upper plate 2 to form the heat pipe 1. Moreover, a square may be preferable in terms of easy production and mounting.

The intermediate plates 10 may each be provided with a protrusion 13 used at a time when the intermediate plates 10 are connected to the upper plate 2 and the lower plate 3. The protrusion 13 is prismatic and disposed at a prescribed place. When the upper plate 2, a plurality of the intermediate plates 10 and the lower plate 3 are overlaid on each other under pressure, the protrusion 13 is crushed and plays a role in gluing the members. Moreover, the protrusion 13 also acts as the positioning standard at a time when they are overlaid on each other.

A plurality of the intermediate plates 10 are sandwiched between the upper plate 2 and the lower plate 3 to finally form the heat pipe 1. Moreover, a plurality of the intermediate plates 10 enable to form an inner space. Inside the inner space is enclosed a cooling medium to allow the heat pipe to perform its function. Each of the upper plate 2, the lower plate 3 and a plurality of the intermediate plates may be chamfered at the corner section for the purpose of enhancing durability. At least one of the upper plate 2, the lower plate 3 and a plurality of the intermediate plates 10 may be provided with a positioning hole or a positioning protrusion for the purpose of positioning them at a time when they are overlaid on each other. In addition, a mark may be provided so as to make it easy to mount them.

A plurality of the intermediate plates 10 sandwiched between the upper plate 2 and the lower plate 3 enable to form an inner space inside the heat pipe 1. Since a cooling medium is enclosed in this inner space, an inlet for pouring the cooling medium may be provided at least one of the upper plate 2 and the lower plate 3. After overlaying all of the upper plate 2, a plurality of the intermediate plates 10 and the lower plate 3 on each other, the cooling medium is enclosed through this inlet. After enclosing the cooling medium, the inner space is vacuumed and the inlet sealed. Inside the inner space is enclosed the cooling medium in this manner to allow the heat pipe to perform its function.

A cooling medium is enclosed in vacuum or under reduced pressure. Since the inner space of the heat pipe 1 is vacuumed or placed under reduced pressure in this process, the cooling medium can be enclosed. Under reduced pressure, the temperature required for the vaporization and condensation of a cooling medium is lowered. The lower temperature has the advantage that the vaporization and condensation of a cooling medium can be repeated at a high speed.

The internal through-hole 11 is provided in each of a plurality of the intermediate plates 10. On each of the intermediate plate are provided a plurality of the internal through-holes 11. The internal through-hole 11 penetrates the intermediate plate 10 from surface to back face. The shape of the internal through-hole 11 may be circular, oval, or square. Since part of each internal through-hole 11 is overlapped on each other to form the capillary tube paths 15, it is preferred that the internal through-hole 11 be square-shaped. A square is preferable in terms of the ease of production as well.

The internal through-hole 11 is provided in each of a plurality of the intermediate plates 10. The internal through-hole 11 may be formed by drilling, press, wet etching, dry etching or the like. Nevertheless, etching such as wet etching and dry etching may be preferable in terms of micromachining and processing accuracy.

The internal through-hole 11 is provided in each of a plurality of the intermediate plates 10. Since a plurality of the intermediate plates 10 are overlaid on each other in such a manner that part of the internal through-hole 11 is overlapped on each other, it is proper that the position of the internal through-hole 11 be shifted from that of the adjacent intermediate plate 10. For example, the position of the internal through-hole 11 in a certain intermediate plate 10 is shifted from the position of the internal through-hole 11 in another internal through-hole 11 adjacent to the first internal through-hole 11 in such a manner that part of the area of the internal through-hole 11 is overlapped on each other. Thus, since the positions of the internal through-holes 11 between adjacent intermediate plates 10 are shifted from each other, it is possible to form capillary tube paths 15 having a cross-sectional area smaller than the cross-sectional area of the internal through-hole 11 in the flat surface direction at a time when a plurality of the intermediate plates 10 are overlaid on each other.

At a time when a plurality of the intermediate plates 10 are overlaid on each other, part of internal through-hole 11 is overlapped on each other such that the capillary tube path 15 has a cross-sectional area smaller than the cross-sectional area of the internal through-hole 11 in the flat surface direction. Such a hole having a cross-sectional area smaller than the cross-sectional area of the internal through-hole 11 is overlaid on each other in the thickness direction of the heat pipe 1, and holes in the thickness direction are connected to each other. As a result, passages are formed in the thickness direction. Moreover, since holes are step-wise in the thickness direction, passages are formed such that a cooling medium can flow not only in the thickness direction but also in the flat surface direction. These passages formed in both the perpendicular direction and the flat surface direction each has a very small cross-sectional area. In other words, these passages are in the capillary tube state. Thus, the capillary tube paths 15 are formed.

Since the capillary tube paths 15 are formed by overlapping only part of each internal through-hole 11 on each other, wherein each capillary tube path has a cross-sectional area smaller than that of the internal through-hole 11, the processing is highly precise as compared with the direct processing of the capillary tube path 15. The capillary tube paths 15 allow circulating a condensed cooling medium. In this case, the cooling medium can be circulated at a high speed because the passages have each a very small cross-sectional area. In addition, capillary tube paths are formed throughout a wide area of the intermediate plates 10, and therefore the condensed cooling medium is circulated not only in the perpendicular direction but in the flat surface direction as well.

Accordingly, the heat pipe 1 can repeat the vaporization and condensation of a cooling medium at a high speed with certainty despite its thin and flat plate-like shape. As a result, a heat pipe that is thin and has a small mounting volume can be achieved. This is an essential configuration at the time of mounting electronic parts on both faces through the via hole 4. It is difficult to mount electronic parts on both faces through the via hole 4 in the prior art where a heat pipe is vertical or perpendicular type and very thick.

The capillary tube paths 15 are circulated not only with a condensed cooling medium but also with a vaporized cooling medium. The vaporized cooling medium may sometimes go through portions other than the capillary tube paths 15 as well. It is also preferred that the corner of the capillary tube path 15 and the concave section 14 be chamfered or provided with R. The capillary tube paths 15 may have a wide variety of sectional shapes such as a hexagon, a circle, an oval, a square, and a polygon. The shape of the capillary tube paths 15 is decided by the shape of the internal through-hole 11 and the way of overlapping the internal through-holes 11 on each other. The cross-sectional area is decided likewise.

The external through-hole 12 is provided for each of the upper plate 2, the lower plate 3 and a plurality of the intermediate plates 10. The heat pipe 1 is constituted by overlaying all of the upper plate 2, the lower plate 3 and a plurality of the intermediate plates 10 on each other; therefore it is preferred that the external through-hole 12 provided on each member be in the same position (and have the same shape and the same area). The number of the external through-hole 12 may be one or multiple in each member. The external through-hole 12 may have various shapes such as a circle, a square, an oval and a polygon. Nevertheless, it is proper that the external through-hole 12 be circular in that the via hole 4 is formed by overlapping the external through-hole 12 on each other.

The external through-hole 12 is not formed after constituting the heat pipe 1 but formed in each member to be overlaid on each other (i.e., each of the upper plate 2, the lower plate 3 and a plurality of the intermediate plates 10) in advance. At the time of forming a through-hole on a plate-like member, there is a processing limit in order to prevent deformations or cracks from occurring at the periphery of the through-hole to be formed. Given that thickness of a plate-like member is t and the diameter of a through-hole $\phi d$, the following processing limit is established in forming a through-hole.

See Mathematical Formula 1:

$$(\tfrac{1}{2})*t \leq \phi d$$

In other words, the thickness of a plate-like member needs to be made small in order to form a smaller through-hole. If a member is thick, the diameter of the through-hole needs to be made large as shown by Mathematical Formula 1. This is because considerable pressure needs to be concentrated on a small region at the time of processing in order to make the diameter of a through-hole small, resulting in a significant impact on the periphery of the through-hole. On the other hand, at the time of forming the via hole 4 in the heat pipe 1, it is preferred that the diameter of the via hole 4 be smaller for the purposes of convenience in use and preventing the deterioration of the performance of the heat pipe 1.

Since there is a processing limit as shown by Mathematical Formula 1, however, the diameter of the via hole 4 needs to be large if the via hole 4 is formed after constituting the heat pipe 1. This is because the diameter of the via hole 4 is influenced by the thickness of the heat pipe 1 no matter how thin the heat pipe 1 may be. On the other hand, in the heat pipe 1, the external through-hole 12 is formed in each member. Although the heat pipe 1 needs to have a given thickness, each of the members to be overlaid on each other can be made considerably thinner than the heat pipe 1. In other words, the diameter of the external through-hole 12 to be provided for each member can be made small.

The heat pipe 1 is constituted by overlaying the upper plate 2, the lower plate 3 and a plurality of the intermediate plates 10 on each other. In this case, the external through-holes 12 provided in the upper plate 2, the lower plate 3 and a plurality of the intermediate plates 10 are overlapped on each other in the same position to form the via hole 4 that penetrates the upper plate 2 all the way through the lower plate 3. As a result, the via hole 4 has a diameter equal to or less than the diameter defined by a processing limit (i.e., the processing limit as shown in Mathematical Formula 1) based on the thickness of the heat pipe 1 or a diameter equal to or greater than the diameter defined by a processing limit (i.e., the processing limit as shown in Mathematical Formula 1) based on the thickness of each member. The diameter of such a via hole 4 is small enough to not exceed the processing limit. As a result, the heat pipe 1 is formed with the via hole 4 capable of causing no problem in terms of processing and production, achieving convenience in use and preventing the deterioration of the performance of the heat pipe 1.

Based on Mathematical Formula 1, for example, the thickness of a member in which the via hole 4 is made needs to be equal to or less than 4 mm in order to make the diameter φd of the via hole 4 2 mm. The thickness of the heat pipe 1 needs to be equal to or less than 4 mm when the via hole 4 is directly formed in the heat pipe 1. Put another way, the diameter φ of the via hole 4 is 2 mm when the via hole 4 is directly formed in the heat pipe 1 having a thickness of 4 mm. On the other hand, in the heat pipe, the external through-hole 12 to form the via hole 4 is formed in each plate-like member (i.e., each of the upper plate 2, the lower plate 3 and a plurality of the intermediate plates 10) similar to one formed by slicing the heat pipe 1 in the thickness direction. Unlike directly forming the via hole 4 in the heat pipe 1, the diameter of the via hole 4 formed eventually therefore depends on the diameter of the external through-hole 12 in each member.

Accordingly, the thickness of the upper plate 2, the lower plate 3 and two sheets of the intermediate plates 10 (i.e., supposing there are two sheets of the intermediate plates) is each about 1 mm even though the thickness of the heat pipe 1 is 4 mm. When the thickness of each member is 1 mm, the diameter φd of the external through-hole 12 can be reduced to a minimum of 0.5 mm. Since via hole 4 is made by superposing the external through-holes 12 on each other, the diameter of the via hole turns out to be 0.5 mm. Thus, the diameter of the via hole 4 in the heat pipe 1 is 0.5 mm, thereby significantly improving the processing limit in the prior art. In this manner, the heat pipe enables to provide a via hole having a minute diameter.

The via hole 4 penetrates the heat pipe 1 from surface to back face; therefore electronic parts, which are exothermic bodies, can be brought into contact with or mounted on both faces of the heat pipe 1. Particularly, an electronic part on the surface can be electrically connected to an electronic part on the back face, or a signal transmitted from an electronic part on the back face can be sent to the surface.

The external through-holes 12 are overlaid on each other to form the via hole 4. In this case, since plate-like members are overlaid on each other, the inner wall of the via hole 4 can be sealed. Accordingly, the inner space of the heat pipe 1 can be kept sealed as well. In order to enhance sealing, of course it is proper to provide a protrusion at the external periphery of each of the external through-hole 12 so that protrusions can be overlapped on each other.

As described above, the heat pipe can have a via hole having a diameter smaller than a processing limit based on the thickness of a heat pipe. In addition, a thin and flat plate-like heat pipe can be produced because capillary tube paths enable to diffuse a vaporized cooling medium and circulate a condensed cooling medium in the flat surface direction. Accordingly, in a combination of a flat plate-like heat pipe and a via hole having a minute diameter, a heat pipe capable of allowing for the high-density packaging and showing high cooling effects can be achieved. Preferable cooling media include water (e.g., pure water and distilled water), ethanol, methanol and acetone. The lower plate 3 and a plurality of the intermediates plates 10 may each have a protrusion for sealing at the external peripheral section and a reinforcing protrusion inside the inner space.

As shown in FIG. 3, the flat plate-like upper plate 2 having the external through-hole 12, the flat plate-like lower plate 3 having the external through-hole 12, and a plurality of the flat plate-like intermediate plates each having the internal through-hole 11 and the external through-hole 12 are arranged in such a manner as to oppose to each other. The number of a plurality of the intermediate plates is not restricted. It is three in FIG. 3. The configuration is such that a plurality of the intermediate plates 10 are sandwiched between the upper plate 2 and the lower plate 3. The members are put together in such a manner that the external through-hole 12 in the upper plate 2, the external through-hole 12 in the lower plate 3, and the external through-holes 12 in a plurality of the intermediate plates are superposed on each other. In addition, a plurality of the intermediate plates 10 are put together such that only part of each internal through-hole 11 provided in each of a plurality of the intermediate plates 10 can be overlapped on each other. The intermediate plates 10 each have a protrusion 13.

The upper plate 2, the lower plate 3 and a plurality of the intermediate plates 10 are overlaid on each other after they are positioned and then bonded together by the heat press. In this case, the members are integrated by direct bonding by the protrusions 13.

As used herein, the term "direct bonding" refers to the thermal processing under pressure in the state where the faces of two members to be bonded together are closely stuck to each other in order to strongly bond atoms by the interatomic force between the face sections. The faces of two members can be integrated without using an adhesive. In this case, the protrusions 13 play a role in achieving the strong bonding. As the conditions of the direct bonding by the heat press, the press pressure is preferably in the range of 40 kg/cm2 to 150 kg/cm2 and the temperature in the range of 250 to 400° C.

Next, a cooling medium is poured through a cooling medium inlet opened at part of the upper plate 2 and/or the lower plate 3. Afterward, the heat pipe 1 is produced by sealing the cooling medium inlet. A cooling medium is enclosed in vacuum or under reduced pressure. Since the inner space of the heat pipe 1 is vacuumed or placed under reduced pressure in this process, the cooling medium can be enclosed. Under reduced pressure, the temperature required for the vaporization and condensation of a cooling medium is lowered. The lower temperature has the advantage that the vaporization and condensation of a cooling medium can be repeated at a high speed.

As a result of the abovementioned manufacturing process, only part of the internal through-holes 11 in each of a plurality of the intermediate plates 10 is overlapped on each other to form capillary tube paths 15, each capillary tube path 15 having a cross-sectional area smaller than the cross-sectional area of the internal through-hole 11 in the flat surface direction. The external through-hole 12 of each member is overlapped on each other in the same position to form the via holes 4 that penetrates the upper plate 2 all the way through the lower plate 3.

Figure 4:
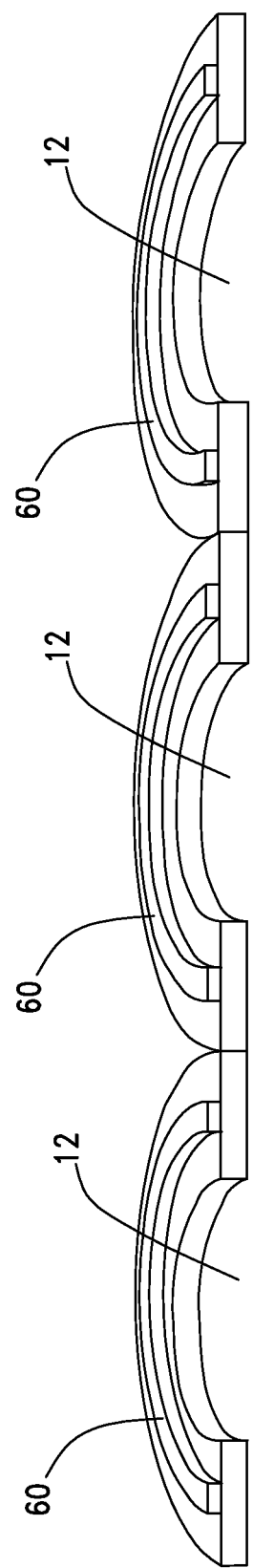
FIG. 4 is an enlarged view at the periphery of external through-holes of the Present Application.

The via hole 4 is formed by overlaying the external through-holes 12 on each other. In this case, the heat pipe 1 cannot be sealed if there should occur any gap at the time of overlaying the external through-holes 12 on each other. Accordingly, at the periphery of the external through-holes 12 are provided seal protrusions 60 as shown in FIG. 4. The upper plate 2, the lower plate 3 and a plurality of the intermediate plates 10 are sealed up by these seal protrusions 60 at a time when they are overlaid on each other.

Figure 5:
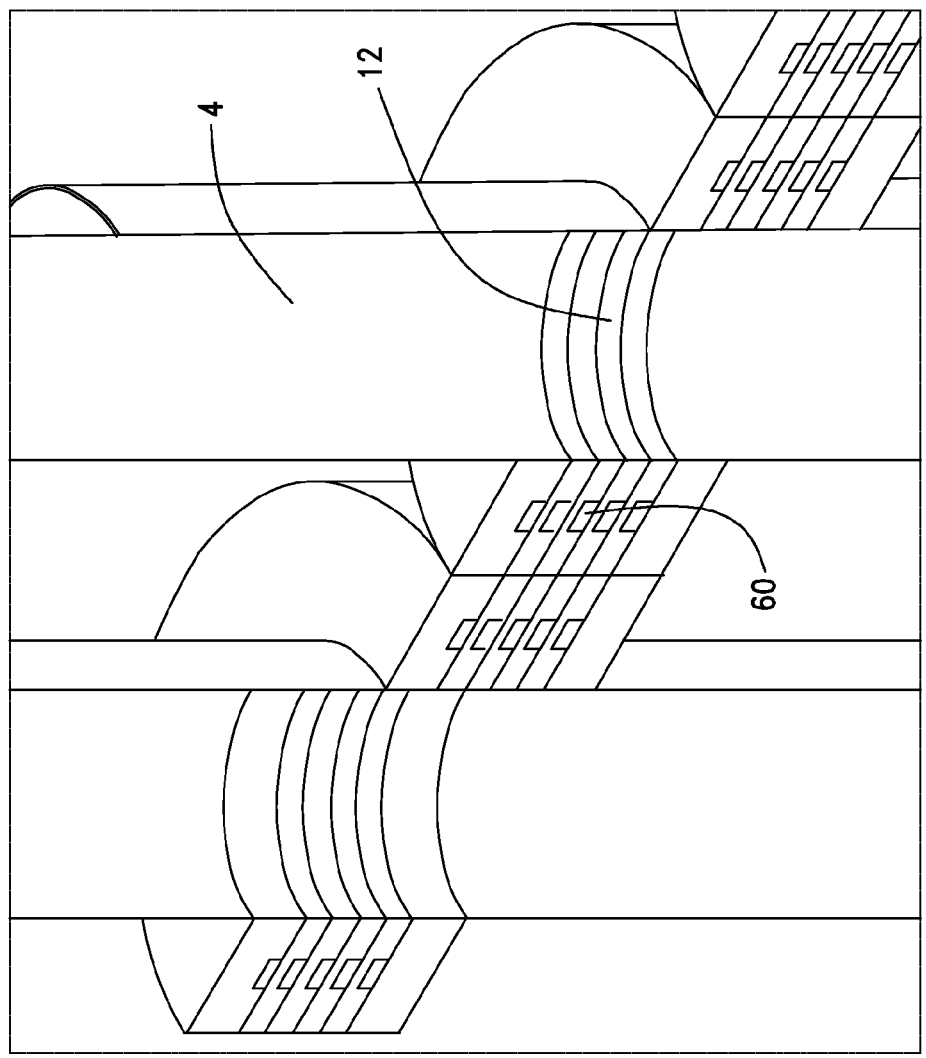
FIG. 5 is an enlarged view of via holes of the Present Application.
Figure 6:
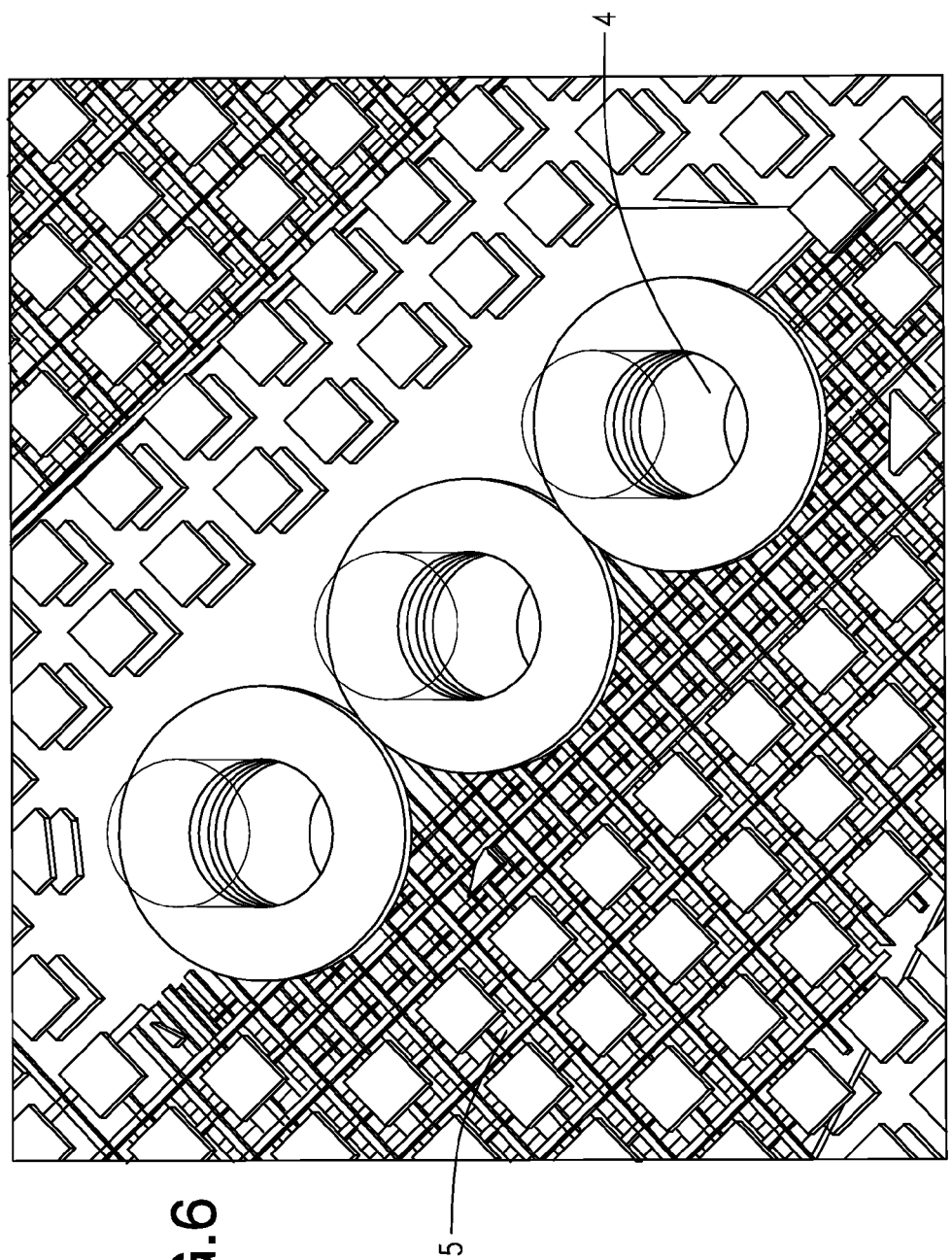
FIG. 6 is an enlarged view at the periphery of via holes the heat pipe of FIG. 5.

FIG. 4 is an enlarged view at the periphery of external through-holes. FIG. 5 is an enlarged view of via holes. FIG. 5 shows the state in which the circumferences of the via holes 4 are sealed up at the time of overlaying upper plate 2, the lower plate 3 and a plurality of the intermediate plates 10 on each other. By joining the seal protrusions 60 together, the plates are strongly bonded together and the heat pipe 1 tightly sealed. FIG. 6 is an enlarged view at the periphery of via holes. As shown in FIG. 6, the via hole 4 is formed by overlaying the external through-holes 12 on each other and the capillary tube paths 15 formed by overlaying the internal through-holes 11 on each other.

As described above, at a time when the via hole 4 is formed by overlaying the external through-holes 12 on each other using the seal protrusions 6, the heat pipe 4 is tightly sealed. As an example, the heat pipe 1 may be manufactured by the abovementioned manufacturing process.

Figure 7:
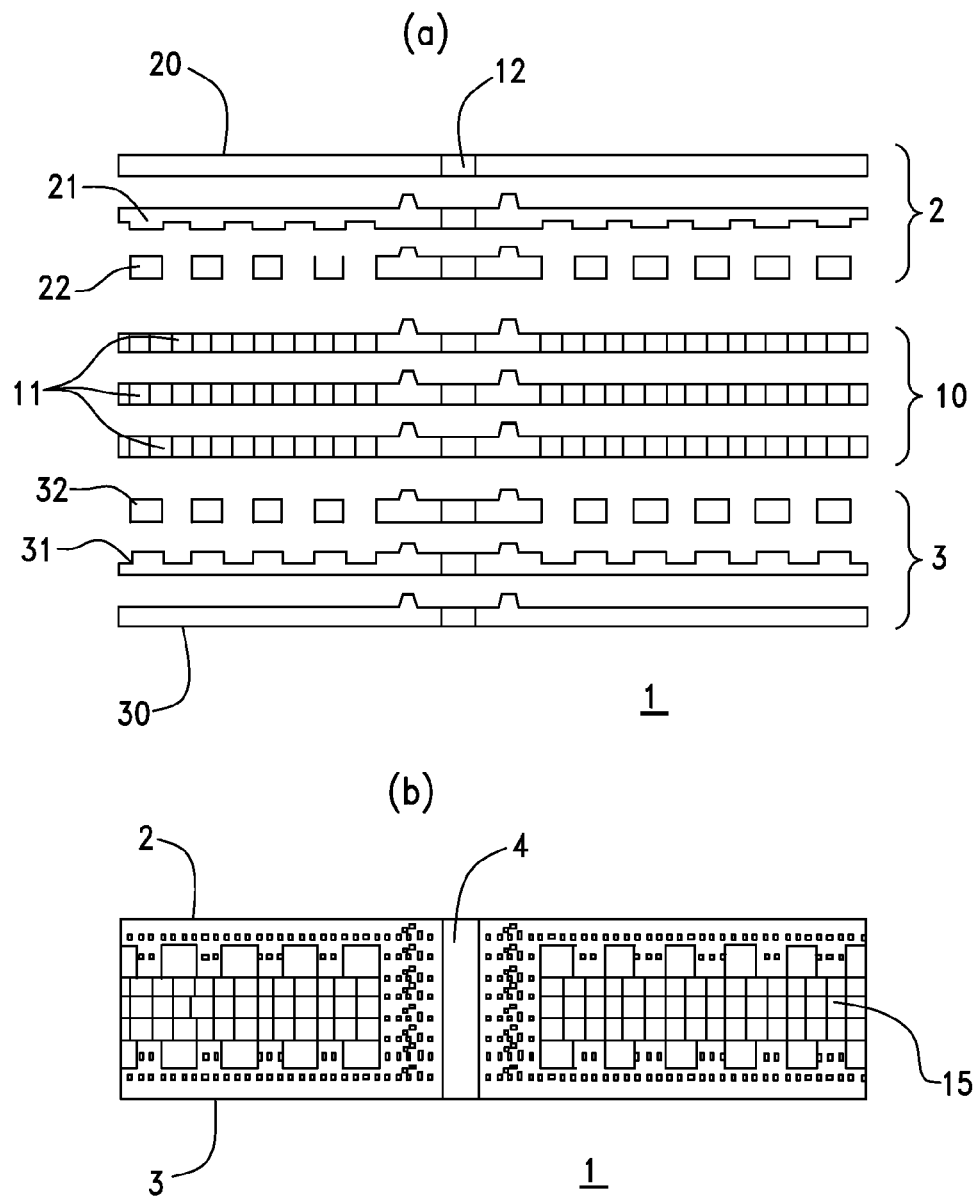
FIG. 7 is a side sectional view of a heat pipe of the Present Application.

FIG. 7 illustrates the case in which at least one of the upper plate 2 and the lower plate 3 is constituted of members bondable in the thickness direction. I n other words, FIG. 7 explains the case in which at least one of the upper plate 2 and the lower plate 3 is constituted of members that are broken up in the sliced form in the thickness direction. The explanation of the same reference numerals as those in FIG. 3 is omitted here.

The heat pipe 1 shown in FIG. 7 is the same as the heat pipe 1 above, in that: the heat pipe 1 is produced by overlaying upper plate 2, the lower plate 3 and a plurality of the intermediate plates 10 on each other; the via hole 4 is formed by overlapping the external through-hole 12 in the upper plate 2, the external through-hole 12 in the lower plate 3, and the external through-holes 12 in a plurality of the intermediate plates 10 on each other; and the capillary tube paths 15 each having a small cross-sectional area is formed by overlapping part of the internal through-hole 11 provided in each of a plurality of the intermediate plates 10 on each other.

In the heat pipe 1 as shown in FIG. 7, the upper plate 2 and the lower plate 3 are constituted of multiple members bondable in the thickness direction. The upper plate 2 is broken up to a first upper plate unit 20, a second upper plate unit 21, and a third upper plate unit 22, and the upper plate 2 is formed by overlaying them on each other. Similarly, the lower plate 3 is broken up to a first lower plate unit 30, a second lower plate unit 31, and a third lower plate unit 32, and the lower plate 3 is formed by overlaying them on each other. The diameter of the external through-hole 12 (i.e., the diameter of the via hole 4 accordingly) can be further reduced by forming at least one (both in FIG. 7) of the upper plate 2 and the lower plate 3 in such a manner as to overlay members broken up in the thickness direction on each other. This is because the diameter of the external through-hole 12 can be made small when the diameter of a member in which the external through-hole 12 is made is small as explained above.

Since the intermediate plates 10 are formed by overlaying multiple plates on each other, the diameter of the external through-hole 12 depends on the thickness of each intermediate plate 10. On the other hand, the upper plate 2 and the lower plate 3 are each one member, and therefore, the miniaturization of the external through-hole 12 is limited. Particularly, the upper plate 2 and the lower plate 3 are often thinner than the intermediate plates 10 in consideration of reliability and durability; therefore the diameter of the via hole 4 may often depend on the thickness of the upper plate 2 and the lower plate 3 than the intermediate plate 10.

In order to solve this problem, as shown in FIG. 7, at least one of the upper plate 2 and the lower plate 3 is constituted of multiple members broken up in the thickness direction. The thickness of each of the first upper plate unit 20, the second upper plate unit 21, and the third upper plate unit 22 is smaller than the thickness of the upper plate 2. Therefore, the diameter of the external through-hole 12 formed in each of the first upper plate unit 20, the second upper plate unit 21, and the third upper plate unit 22 can be made smaller than that described above. The upper plate 2 is formed by overlaying the first upper plate unit 20, the second upper plate unit 21, and the third upper plate unit 22 on each other.

The thickness of each of the first lower plate unit 30, the second lower plate unit 31, and the third lower plate unit 32 is smaller than the thickness of the lower plate 3. Therefore, the diameter of the external through-hole 12 formed in each of the first lower plate unit 30, the second lower plate unit 31, and the third lower plate unit 32 can be made smaller than that described above. The lower plate 3 is formed by overlaying the first lower plate unit 30, the second lower plate unit 31, and the third lower plate unit 32 on each other. Thus, the diameter of the via hole 4 can be further reduced by constituting at least one of the upper plate 2 and the lower plate 3 of multiple members broken up in the thickness direction.

Here, the first upper plate unit 20 and the first lower plate unit 30 are each a flat plate-like member having the external through-hole 12. The second upper plate unit 21 and the second lower plate unit 31 are each a plate-like member having the external through-hole 12 and part of the concave section 14, wherein the bottom portion is formed. The third upper plate unit 22 and the third lower plate unit 32 are each a plate-like member having the external through-hole 12 and part of the concave section 14, wherein the tip portion is formed. When the second upper plate unit 21 and the third upper plate unit 22 are overlaid on each other, the concave section 14 is formed. Similarly, when the second lower plate unit 31 and the third lower plate unit 32 are overlaid on each other, the concave section 14 is formed. In FIG. 7, the third upper plate unit 22 and the third lower plate unit 32 are arranged in such a manner that walls forming the concave sections 14 are broken up and separated from each other. However, they can be overlaid on other members with ease by mutually bridging them, for example. In the upper plate 2 and the lower plate 3, members (units) may be overlaid on each other first, or they may be overlaid on each other together with a plurality of the intermediate plates 10 before bonding.

In FIG. 7, each of the upper plate 2 and the lower plate 3 is constituted of three members. However, they may be each constituted of two members or four members or more instead of three members. Of course only one of the upper plate 2 and the lower plate 3 may be constituted of multiple members.

As shown in FIG. 7(*b*), the heat pipe 1 is manufactured by overlaying and bonding the multiple members constituting the upper plate 2, a plurality of the intermediate plates 10, and the multiple members constituting the lower plate 3 together by heat press or another method. The external through-holes 12 of those members are superposed on each other by such overlaying and bonding to form the via hole 4.

The heat pipe enables to achieve the via hole 4 having a smaller diameter. Additionally, a heat pipe may have a vapor diffusion path formed by a gap. Besides, the heat pipe has a via hole in the vicinity of the borderline between a vapor diffusion path and a capillary tube path.

Figure 8:
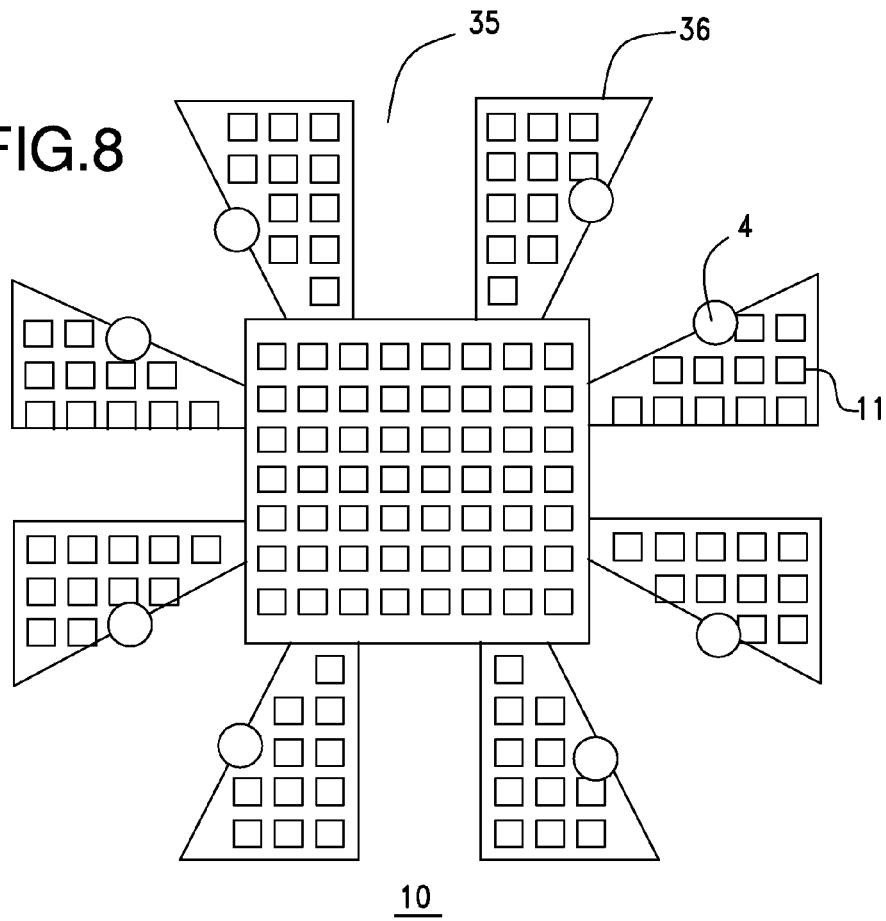
FIG. 8 is a top view of an intermediate plate of the Present Application.
Figure 9:
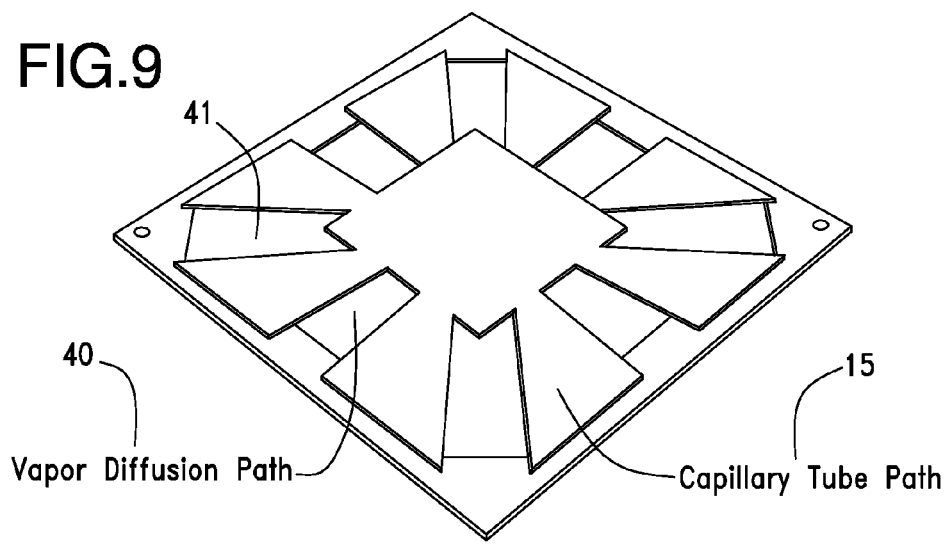
FIG. 9 is a photo showing the inner structure of the heat pipe of FIG. 7.

The intermediate plate 10 as shown in FIG. 8 has a notch section 35 and a plate section 36. In FIG. 8, the notch section 35 and the plate section 36 are provided alternately. At the central portion of the intermediate plate 10 is provided the plate section 36. The plate section 36 is provided with a plurality of the internal through-holes 11. When a plurality of the intermediate plates 10 are overlaid on each other, only part of each internal through-hole 11 is overlapped on each other to form the capillary tube paths 15, each capillary tube path having a cross-sectional area smaller than the cross-sectional area of the internal through-hole in the flat surface direction. On the other hand, when a plurality of the intermediate plates 10 are overlaid on each other, the notch sections 35 are overlapped on each other to form the inner space 41 in the heat pipe 1. The inner space 41 is formed because the thickness of space is created by overlapping the notch sections 35 on each other. This inner space 41 is a space having a given volume in the heat pipe 1 and acts as the vapor diffusion paths 40 where a cooling medium vaporized by heat generated from an exothermic body is diffused in both the flat surface direction and the perpendicular direction. Particularly when the vapor diffusion paths 40 are formed radially as shown in FIG. 9, a vaporized cooling medium is diffused radially. The vaporized medium diffused via the vapor diffusion path 40 is cooled and condensed on the heat releasing face. The condensed cooling medium is liquid and, therefore, is circulated via the capillary tube paths 15.

Since the capillary tube paths 15 and the vapor diffusion paths 40 are formed inside the heat pipe 1, a vaporized cooling medium is diffused and a condensed cooling medium condensed at a high speed in both the flat surface direction and the perpendicular direction. In the heat pipe 1, the external through-hole 12 (i.e., the via hole 4) is disposed in the vicinity of the borderline between the notch section 35 and the plate section 36. In the upper plate 2, the lower plate 3, and a plurality of the intermediate plates 10, the external through-hole 12 is formed in the vicinity of the borderline between the notch section 35 and the plate section 36. The position of the external through-hole 12 in the upper plate 2, the lower plate 3, and a plurality of the intermediate plates 10 may be decided depending on the shape of the intermediate plate 10.

When the upper plate 2, the lower plate 3, and a plurality of the intermediate plates 10 are overlaid on each other, the external through-holes 12 are overlapped on each other to form the via hole 4 that penetrates the upper plate 2 all the way through the lower plate 3. In the heat pipe 1, the via hole 4 is formed in the vicinity of the borderline between the notch section 35 and the plate section 36. In other words, the via hole 4 is formed in the vicinity of the borderline between the vapor diffusion path 40 and the capillary tube path 15.

Since the via hole 4 is formed in the vicinity of the borderline between the vapor diffusion path 40 and the capillary tube path 15, the movement of a condensed cooling medium circulating through the capillary tube path and the movement of a vaporized cooling medium diffusing through the vapor diffusion path 40 can hardly be prevented. Neither the capillary tube path 15 nor the vapor diffusion path 40 is formed at a place where there is the via hole 4 because no inner space is formed there in the heat pipe 1. Therefore, the circulation path of a cooling medium is significantly blocked if the via hole 4 is formed at the center of the capillary tube path 15, and the diffusion path of a vaporized cooling medium is significantly blocked if the via hole 4 is formed at the center of the vapor diffusion path 40. Moreover, it is also important to spread the influence of the via hole 4 on the vapor diffusion path 40 and the capillary tube path 15.

On the other hand, in the heat pipe 1, the via hole 4 is formed in the vicinity of the borderline between the vapor diffusion path 40 and the capillary tube path 15. Therefore, the influence of the via hole 4 on only one of them can be reduced, or the influence can be balanced. Thus, the heat pipe 1 enables to achieve the via hole 4 that hardly prevents the movement of a cooling medium.

In FIGS. 8-9, the vapor diffusion path 40 was radial. It goes without saying, however, that this is only one example. Other shapes may be acceptable. As far as the position where the via hole 4 is formed is concerned, it may extend over both the notch section 35 and the plate section 36 or in the vicinity of the borderline between them and within the region of either one.

The heat pipe according to the Present Application is not particularly restricted in its size. Practically, however, it may be preferred that the size of the heat pipe be within a certain range. By way of example, the heat pipe 1 is a square of at least 20 square millimeters and not more than 100 square millimeters and having a thickness of at least 1 mm and not more than 5 mm. The size is specified in this manner based on the sizes of electronic parts, which are exothermic bodies to be cooled, and the ease of mounting it on a circuit board. Of course, the size of a heat pipe is not particularly limited to the abovementioned size and may be decided depending on the needs in production, needs in use, needs in mounting and the like.

Figure 10:
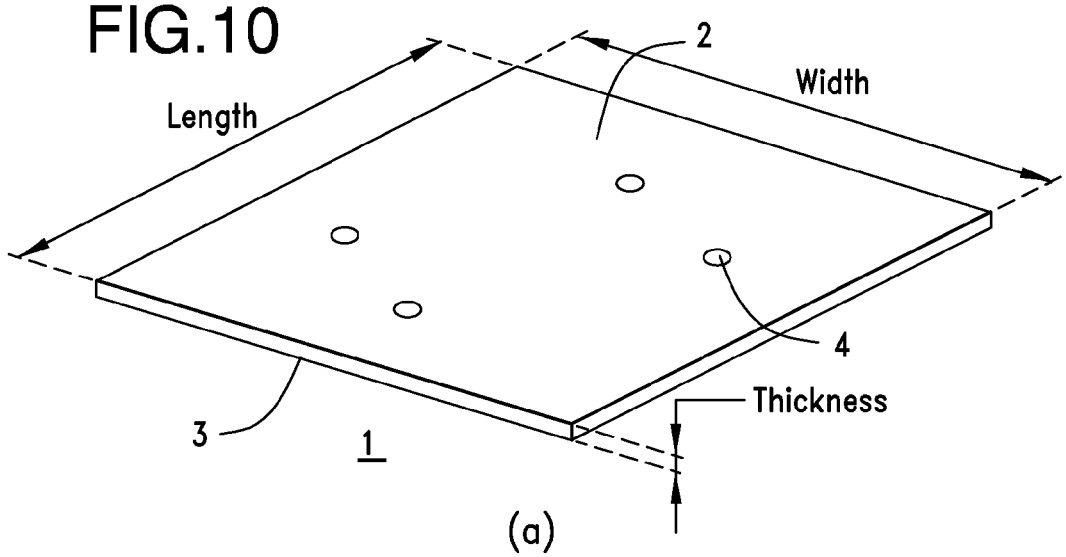
FIG. 10 is a perspective view of a heat pipe of the Present Application.

FIG. 10 is a perspective view of a heat pipe. As described, the heat pipe 1 is formed by overlaying and bonding the upper plate 2, the lower plate 3 and a plurality of the intermediate plates 10 together. The external through-hole 12 provided in each member is overlapped on each other to form the via hole 4 that penetrates the upper plate 2 all the way through the lower plate 3. As described, the internal through-hole 11 is provided in each of a plurality of the intermediate plates 10, and only part of the internal through-hole 11 is overlapped on each other to form the capillary tube paths 15, each capillary tube path having a cross-sectional area smaller than the cross-sectional area of the internal through-hole 11 in the flat surface direction.

The heat pipe 1 shown in FIG. 10 is exactly the same as the heat pipes described above except for the sizes described in the drawing. As shown in FIG. 10, the heat pipe 1 has parameters relating to the sizes of length, width and thickness. Here, the heat pipe 1 has the following sizes:

20 mm≤length≤100 mm 20 mm≤width≤100 mm 1 mm≤thickness≤5 mm The heat pipe 1 based on these sizes not only shows the same effects as those described above but also is suitable for the sizes of electronic parts and the like to be cooled.

Figure 11:
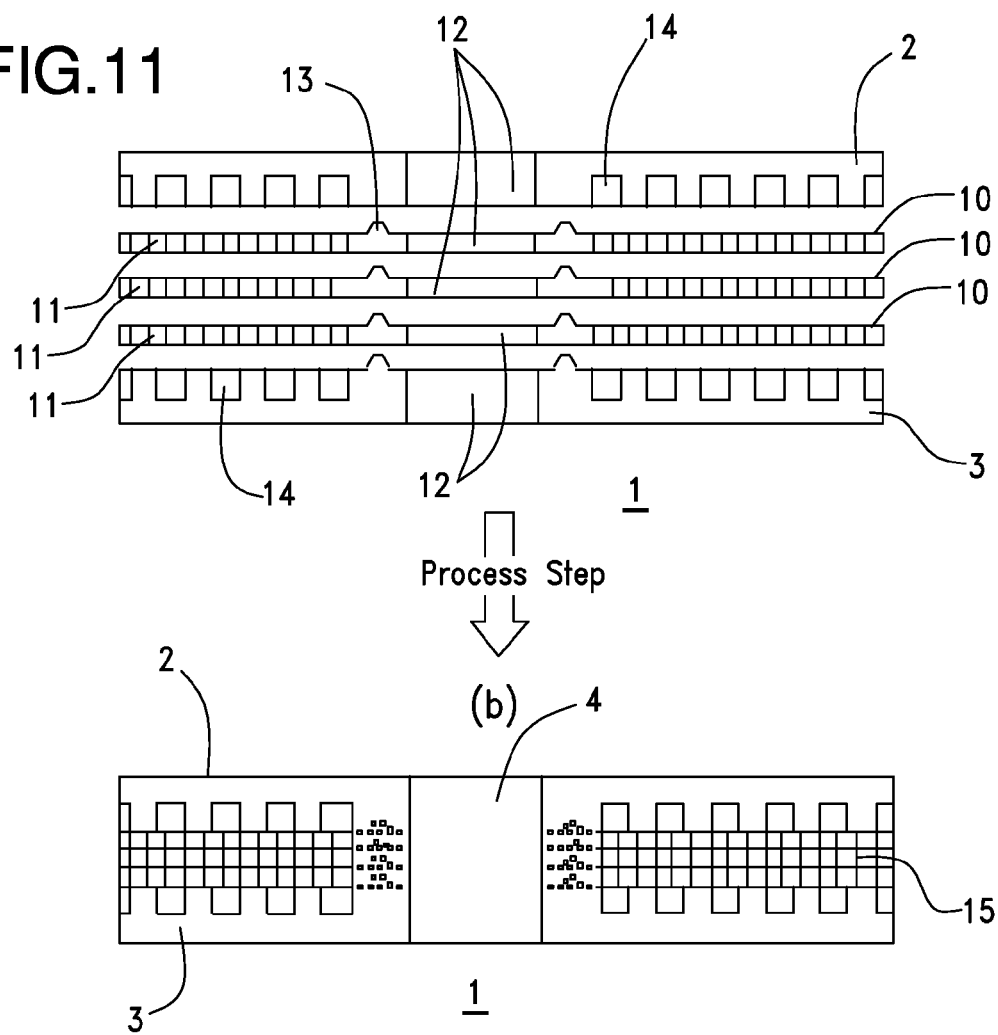
FIG. 11 is an explanatory view explaining the production process of a heat pipe of the Present Application.

FIG. 11 is an explanatory view explaining the production process of a heat pipe. First, the flat plate-like upper plate 2 having the external through-hole 12 is prepared. Next, the flat plate-like lower plate 3 is prepared, the lower plate 3 being opposed to the upper plate 2 and having the external through-hole 12. It is preferred that the lower plate 3 have the same shape and area as those of the upper plate 2 in view of easy production and the ease of handling a manufactured heat pipe.

Of course the lower plate 3 may have the shape and area different from those of the upper plate 2.

Next, a plurality of the intermediate plates 10 sandwiched between the upper plate 2 and the lower plate 3 are prepared, each intermediate plate having the external through-hole 12 and the internal through-hole 11. A plurality of the intermediate plates 10 are prepared in such a manner as to be sandwiched between the upper plate 2 and the lower plate 3 in the region where the upper plate 2 and the lower plate 3 are facing each other. It is preferred that a plurality of the intermediate plates 10 have the same shape and area as those of the upper plate 2 in view of easy production and the ease of handling a manufactured heat pipe. FIG. 11 shows three intermediate plates 10. However, any number of plates may be acceptable as far as the number is more than one.

The external through-hole 12 of the upper plate 2, the external through-hole 12 of the lower plate 3, and the external through-holes 12 of a plurality of the intermediate plates 10 are each provided in the same position when they are overlaid on each other. As shown in FIG. 11(*b*), when the heat pipe 1 is manufactured by overlaying all of the upper plate 2, the lower plate 3 and a plurality of the intermediate plates 10 on each other, all the external through-holes 12 are connected to each other in the overlaying direction (i.e., in the thickness direction) to form the via hole 4 that penetrates the upper plate 2 all the way through the lower plate 3.

Only part of the internal through-hole 11 provided in each of a plurality of the intermediate plates is overlapped on each other. As a result of the partial overlapping, the capillary tube paths 15 are formed, each capillary tube path having a cross-sectional area smaller than the cross-sectional area of the internal through-hole 11 in the flat surface direction. The capillary tube paths 15 allow circulating a condensed cooling medium.

As a result of overlaying a plurality of the intermediate plates 10, a space is formed inside at a place sandwiched between the upper plate 2 and the lower plate 3. In this inner space is enclosed a cooling medium. The enclosed cooling medium is evaporated by heat generated from an exothermic body. The cooling medium absorbs heat generated from the exothermic body by latent heat at the time of the evaporation. The evaporated cooling medium is cooled and condensed on the surface of the heat pipe 1 to be liquefied again. As a result of the liquefaction, heat absorbed from the exothermic body is released. The condensed cooling medium is circulated via the capillary tube paths 15.

The upper plate 2, the lower plate 3, and a plurality of the intermediate plates 10 are each positioned and then bonded together. In the bonding, the heat press is used, wherein heat and pressure are added. A plurality of the intermediate plates 10 each have the protrusion 13. This protrusion 13 not only is used for positioning at the time of overlaying upper plate 2, the lower plate 3, and a plurality of the intermediate plates 10 on each other but also acts as an adhesive at the time of the bonding.

The upper plate 2, the lower plate 3 and a plurality of the intermediate plates 10 are overlaid on each other after they are positioned and then bonded together by the heat press. In this case, the members are integrated by direct bonding by the protrusions 13. As used herein, the term "direct bonding" refers to the thermal processing under pressure in the state where the faces of two members to be bonded together are closely stuck to each other in order to strongly bond atoms by the interatomic force between the face sections. The faces of two members can be integrated without using an adhesive. In this case, the protrusions 13 play a role in achieving the strong bonding. As the conditions of the direct bonding by the heat press, the press pressure is preferably in the range of 40 kg/cm2 to 150 kg/cm2 and the temperature in the range of 250 to 400° C.

Next, a cooling medium is poured through a cooling medium inlet opened at part of the upper plate 2 and/or the lower plate 3. Afterward, the heat pipe 1 is produced by sealing the cooling medium inlet. A cooling medium is enclosed in the inner space using an inlet provided for part of the upper plate 2 and or the lower plate 3. To take just one example, a cooling medium inlet and an air outlet are provided, and a prescribed amount of a cooling medium is poured (as the cooling medium is poured from the cooling medium inlet, air is discharged from the air outlet). After the cooling medium is poured, the cooling medium inlet and the air outlet are sealed with a plastic metal to complete the heat pipe 1 with a cooling medium enclosed.

A cooling medium is enclosed in vacuum or under reduced pressure. Since the inner space of the heat pipe 1 is vacuumed or placed under reduced pressure in this process, the cooling medium can be enclosed. Under reduced pressure, the temperature required for the vaporization and condensation of a cooling medium is lowered. The lower temperature has the advantage that the vaporization and condensation of a cooling medium can be repeated at a high speed. Alternatively, after enclosing a cooling medium, vacuum drawing is performed to remove unnecessary air and impurities from the inner space of the heat pipe 1. Afterward, the cooling medium inlet is sealed. By such a manufacturing method, the thin and flat plate-like heat pipe 1 is produced, the heat pipe having the capillary tube paths 15 and the via hole 4.

Figure 12:
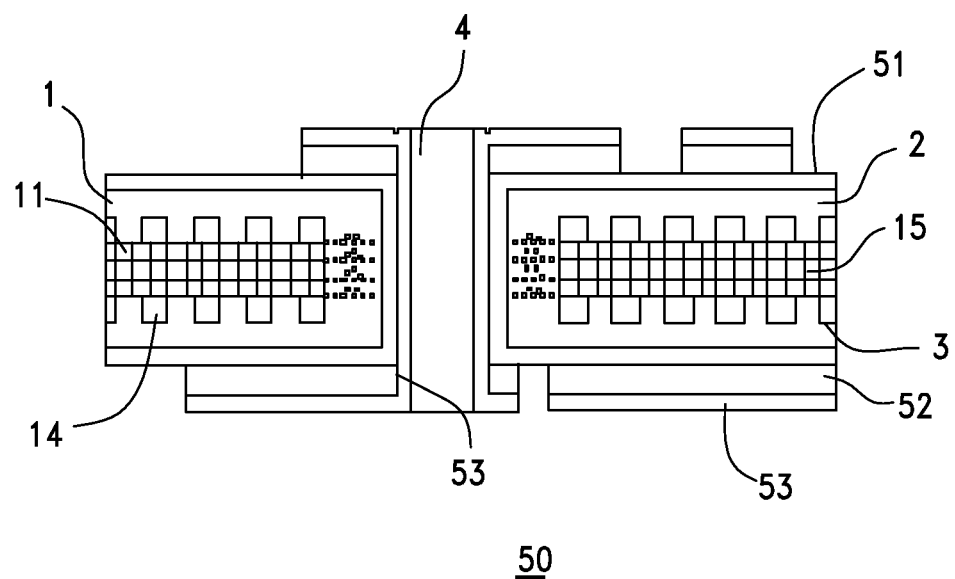
FIG. 12 is a side view of a circuit board having a heat pipe function of the Present Application.

Referring to FIG. 12, a circuit board 50 with a heat pipe function has a wiring layer on at least one of the surface of the heat pipe 1, the back face of the heat pipe 1, and the inner face of the via hole 4, the heat pipe having the via hole 4 described above. This wiring layer allows electronic parts (including those to be cooled and those to not be cooled) to be mounted on the surface of the heat pipe. In other words, a circuit board with a heat pipe function can be produced.

The circuit board 50 with a heat pipe function has an insulating layer 51 on each of the surface of the heat pipe 1 and the back face of the heat pipe 1, the heat pipe being described above. Since it is made of a metal such as copper and aluminum, the surface of the heat pipe 1 needs to be insulated in order to mount a circuit board on its surface. The insulating layer 51 is formed by coating a cation type polyimide electrocoating material. In FIG. 12, we selected a cation type polyimide electrocoating paint. The thickness of the insulating layer 51 is not particularly restricted. Nevertheless, it is preferred that the thickness of the insulating layer 51 be in the range of 5 to 20 μm where pinholes hardly occur.

The circuit board 50 with a heat pipe function also has a conductive layer 52 on the outside of the insulating layer 51. The conductive layer 52 plays a role in electrically connecting mounted electronic parts to each other. The conductive layer 52 is formed by depositing copper foil using the hot press, the copper foil being used most frequently in printed circuit boards. The conductive layer 52 is formed by etching. Etching resist is applied onto the conductive layer 52, followed by patterning exposure, development and etching processing in this order. Then, the conductive layer 52 is removed from the via hole 4. Finally, the resist is detached to form the insulating layer 51 and the conductive layer 52 on the surface of the heat pipe 1.

Furthermore, the circuit board 50 with a heat pipe function has a plated layer 53 for the purpose of electrically connecting the via hole 4 to mounted electronic parts. Copper plating or the like is used for the plated layer 53. The plated layer 53 is formed by performing electrolytic copper plating to a thickness of 5 to 10 μm on an electroless copper layer coated as the foundation to a thickness of 0.5 μm or so.

This plated layer enables electronic parts mounted on both the surface and the back face of the heat pipe 1 to be connected to each other through the via hole 4. As a result, the heat pipe 1 can be used on a circuit board on which electronic parts can be mounted. This method has the advantage that heat generated from electronic parts can be cooled by the heat pipe 1 since the electronic parts are mounted on the main body of the heat pipe 1. Particularly when electronic parts are mounted on both the surface and the back face of the heat pipe 1 at places where the electronic parts are not facing each other, the electronic parts can be properly cooled on both faces. Moreover, since the via hole 4 formed in the heat pipe 1 is so small that it does not cause any problem in terms of the strength and durability of the heat pipe 1. In addition, it has little influence on the cooling capability characteristic of the main body, either. Moreover, electronic parts can be mounted on both faces through the via hole 4.

Figure 13:
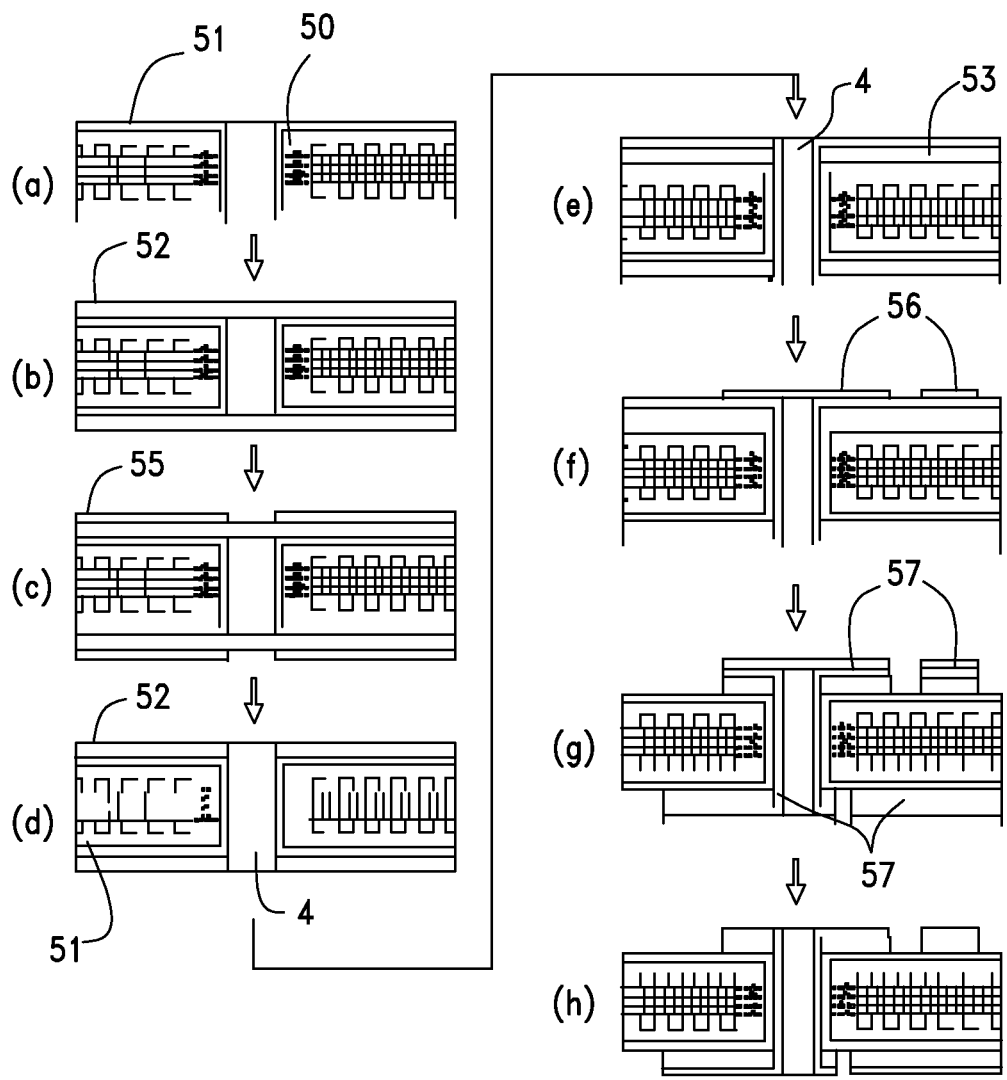
FIG. 13 is a process drawing showing the manufacturing process of a circuit board having the heat pipe function of FIG. 12.

Electronic parts can be mounted on both faces of the heat pipe 1. Additionally, an electronic part mounted on the surface of the heat pipe 1 may be connected to another circuit board. Thus, the circuit board 50 with a heat pipe function enables to mount electronic parts flexibly. First, as shown in FIG. 13(a), the insulating layer 51 is applied to the surface of the heat pipe 1 and the inner face of the via hole 4. The insulating layer 51 preferably has a thickness of 5 to 20 μm.

Next, as shown in FIG. 13(b), the conductive layer 52 is formed on the surface of the insulating layer 51. The conductive layer 52 is formed of copper foil deposited by the hot press. The conductive layer 52 preferably has a thickness of 15 to 35 μm.

Next, as shown in FIG. 13(c), the conductive layer 52 is formed by etching. Specifically, the etching resist 55 is applied to the portions other than the via hole 4, followed by patterning exposure, development and etching processing in this order. Then, the conductive layer 52 is removed centering on the via hole 4.

Next, as shown in FIG. 13(d), the etching resist 55 is detached. As a result of detaching the etching resist 55, the insulating layer 51 and the conductive layer 52 are formed on portions other than the via hole 4.

Next, as shown in FIG. 13(e), the plated layer 53 is formed so as to electrically conduct the via hole 4. The plated layer 53 is formed on each of the surface of the heat pipe 1, the back face of the heat pipe 1, and the inner peripheral surface of the via hole 4. Copper plating is preferably used for the plated layer 53. It is proper to apply electrolytic copper plating onto an electroless copper plated layer used as the foundation. Here, it is preferred that the electroless copper plating be applied to a thickness of about 0.5 μm and the electrolytic copper plating to the thickness of 5 to 10 μm.

As shown in FIG. 13(f), the resist 56 is applied for the purpose of etching the via hole 4 and the conductive layer 52 together. After coating the resist 56, patterning exposure and development are performed.

Next, as shown in FIG. 13(g), a circuit board 57 is formed by etching. The circuit board 57 having a necessary wiring pattern is formed by etching the plated layer 53 and the conductive layer 52.

Finally, FIG. 13(h) shows the completed circuit board 50 with a heat pipe function, wherein all the resist 56 shown in FIG. 13(g) has been detached. As a result, what was achieved is the function of electrical connectability through the via hole 4.

While a preferred embodiment of the Present Application is shown and described, it is envisioned that those skilled in the art may devise various modifications without departing from the spirit and scope of the foregoing Description and the appended Claims. The circuit board with a heat pipe function thus manufactured allows cooling and mounting electronic parts at the same time without inhibiting the high-density packaging of electronic parts. These heat pipes and circuit boards with a heat pipe function can be used in a wide variety of fields including electronic equipment, manufacturing machinery, industrial machinery, automobiles and aircraft equipment. Further, the Present Application can be properly applied to the fields of cooling exothermic bodies such as electronic parts and electronic elements.

What is claimed is:

1. A heat pipe for cooling an exothermic body by the vaporization and condensation of an enclosed cooling medium, the heat pipe comprising:
    a flat plate-like upper plate;
    a flat plate-like lower plate opposed to the upper plate; and
    a plurality of flat plate-like intermediate plates overlaid on each other between the upper plate and the lower plate, the intermediate plates including internal through-holes;
    wherein:
        the internal through-holes are adapted such that only part of each through-hole is overlapped on each other to form capillary tube paths, each capillary tube path having a cross-sectional area smaller than the cross-sectional area of the internal through-hole in the flat surface direction; and
        each of the upper plate, the lower plate and a plurality of the intermediate plates each include an external through-hole, the external through-holes being superposed on each other to form a via hole.

2. The heat pipe of claim 1, wherein the external through-holes provided in each of the upper plate, the lower plate and a plurality of the intermediate plates are smaller than a diameter based on the processing limit to the thickness of the heat pipe and equal to or greater than a diameter based on the processing limit to the thickness of each of the upper plate, the lower plate and a plurality of the intermediate plates.

3. The heat pipe of claim 2, wherein the processing limit is represented by the following expression:

$$(½)*t \leq \phi d,$$

wherein the thickness of a plate forming the external through-hole is t and the diameter of the external through-hole φd.

4. The heat pipe of claim 3, wherein at least one of the upper plate, the lower plate and the intermediate plates is constituted of a plurality of members, the members being able to be bonded together in the thickness direction.

5. The heat pipe of claim 4, wherein the upper plate having the external through-hole, the lower plate having the external through-hole and a plurality of the intermediate plates each having the internal through-hole and the external through-hole are overlaid on each other by sandwiching a plurality of the intermediate plates between the upper plate and the lower plate.

6. The heat pipe of claim 5, wherein the external through-hole formed in the upper plate, the external through-hole formed in the lower plate and the external through-holes formed in a plurality of the intermediate plates are superposed on each other to form a via hole, the via hole penetrating the upper plate all the way through the lower plate.

7. The heat pipe of claim 6, wherein the internal through-holes formed in each of a plurality of the intermediate plates are adapted such that only part of each through-hole is overlapped on each other to form capillary tube paths, each having a cross-sectional area smaller than the cross-sectional area of the through-hole in the flat surface direction.

8. The heat pipe of claim 7, wherein each intermediate plate comprises a notch section and a plate section.

9. The heat pipe of claim 8, wherein the notch section provided in each intermediate plate is overlapped on each other to form a vapor diffusion path, the vapor diffusion path being an internal space.

10. The heat pipe of claim 9, wherein the vapor diffusion path diffuses a vaporized cooling medium generated by the vaporization of an enclosed cooling medium.

11. The heat pipe of claim 10, wherein the capillary tube path circulates a condensed cooling medium generated by the condensation of the enclosed cooling medium.

12. The heat pipe of claim 11, wherein the via hole is disposed in the vicinity of the borderline between the plate section and the notch section in a plurality of the intermediate plates.

13. The heat pipe of claim 12, wherein each of the upper plate and the lower plate further comprises a concave section, the concave section being linked to the capillary tube path.

14. The heat pipe of claim 13, the heat pipe being a square of at least 20 mm$^2$ and not more than 100 mm$^2$ and having a thickness of at least 1 mm and not more than 5 mm.

15. A heat pipe to be produced by overlaying on each other a flat plate-like upper plate having an external through-hole, a flat plate-like lower plate opposed to the upper plate and having an external through-hole and a plurality of intermediate plates sandwiched between the upper plate and the lower plate and each having an external through-hole and an internal through-hole, wherein:

the external through-hole formed in the upper plate, the external through-hole formed in the lower plate and the external through-holes formed in a plurality of the intermediate plates are superposed on each other to form a via hole, the via hole penetrating the upper plate all the way through the lower plate; and the internal through-holes formed in each of a plurality of the intermediate plates are adapted such that only part of each through-hole is overlapped on each other to form capillary tube paths, each having a cross-sectional area smaller than the cross-sectional area of the through-hole in the flat surface direction.

16. The heat pipe of claim 15, wherein a plurality of the intermediate plates are sandwiched between the upper plate and the lower plate to form an enclosed internal space, the internal space having an enclosed cooling medium.

* * * * *